United States Patent
McGee, III et al.

(10) Patent No.: US 10,419,699 B1
(45) Date of Patent: Sep. 17, 2019

(54) METHOD FOR SHIFT REGISTER DIGITAL IN PIXEL UNIT CELL

(71) Applicant: RAYTHEON COMPANY, Waltham, MA (US)

(72) Inventors: John F. McGee, III, Plano, TX (US); Matthew Jonas, McKinney, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/946,113

(22) Filed: Apr. 5, 2018

(51) Int. Cl.
| | |
|---|---|
| *H04N 5/372* | (2011.01) |
| *H04N 5/378* | (2011.01) |
| *H04N 5/353* | (2011.01) |
| *G11C 19/28* | (2006.01) |
| *H04N 5/374* | (2011.01) |
| *H04N 5/3745* | (2011.01) |

(52) U.S. Cl.
 CPC ......... *H04N 5/37206* (2013.01); *G11C 19/28* (2013.01); *H04N 5/353* (2013.01); *H04N 5/378* (2013.01); *H04N 5/3742* (2013.01); *H04N 5/37452* (2013.01); *H04N 5/37455* (2013.01)

(58) Field of Classification Search
 CPC ........... H04N 5/37455; H04N 5/37452; H04N 5/3742; H04N 5/3745; H04N 5/37206; H04N 5/378; H04N 5/353
 See application file for complete search history.

(56) References Cited

U.S. PATENT DOCUMENTS

| | | | |
|---|---|---|---|
| 3,030,581 A | 4/1962 | Johnson | |
| 3,819,954 A | 6/1974 | Butler et al. | |
| 4,218,665 A * | 8/1980 | Fujisaki | H03H 15/02 327/284 |
| 5,315,114 A * | 5/1994 | Kansy | H04N 5/33 250/332 |
| 6,459,077 B1 * | 10/2002 | Hynecek | H04N 27/14856 250/208.1 |

(Continued)

FOREIGN PATENT DOCUMENTS

| | | |
|---|---|---|
| WO | 2012135542 A1 | 10/2012 |
| WO | 2013127450 A1 | 9/2013 |

OTHER PUBLICATIONS

International Search Report and Written Opinion in application No. PCT/US2019/016472 dated Apr. 10, 2019.

*Primary Examiner* — Ngoc Yen T Vu

(74) *Attorney, Agent, or Firm* — Lando & Anastasi, LLP

(57) ABSTRACT

According to one aspect, embodiments herein provide a digital unit cell comprising a photodiode, an integration capacitor coupled to the photodiode and configured to accumulate charge generated by the photodiode responsive to an input light signal incident on the photodiode over an integration period, a comparator coupled to the integration capacitor and configured to compare a voltage across the integration capacitor with a voltage reference and to generate a clock signal at a first level each time a determination is made that the voltage across the integration capacitor is greater than the voltage reference, a shift register coupled to the comparator and configured to receive the clock signal from the comparator and increase a count value each time the clock signal at the first level is received from the comparator, and an output coupled to the shift register and configured to provide the count value to an external system.

20 Claims, 3 Drawing Sheets

(56) References Cited

U.S. PATENT DOCUMENTS

| | | | |
|---|---|---|---|
| 6,762,795 B1 * | 7/2004 | Chen | H04N 5/37206 |
| | | | 348/295 |
| 8,179,296 B2 | 5/2012 | Kelly et al. | |
| 8,625,012 B2 | 1/2014 | Yuan et al. | |
| 8,704,144 B2 | 4/2014 | Elliott et al. | |
| 9,154,713 B2 | 10/2015 | Denham et al. | |
| 2014/0061442 A1 | 3/2014 | Denham | |

* cited by examiner

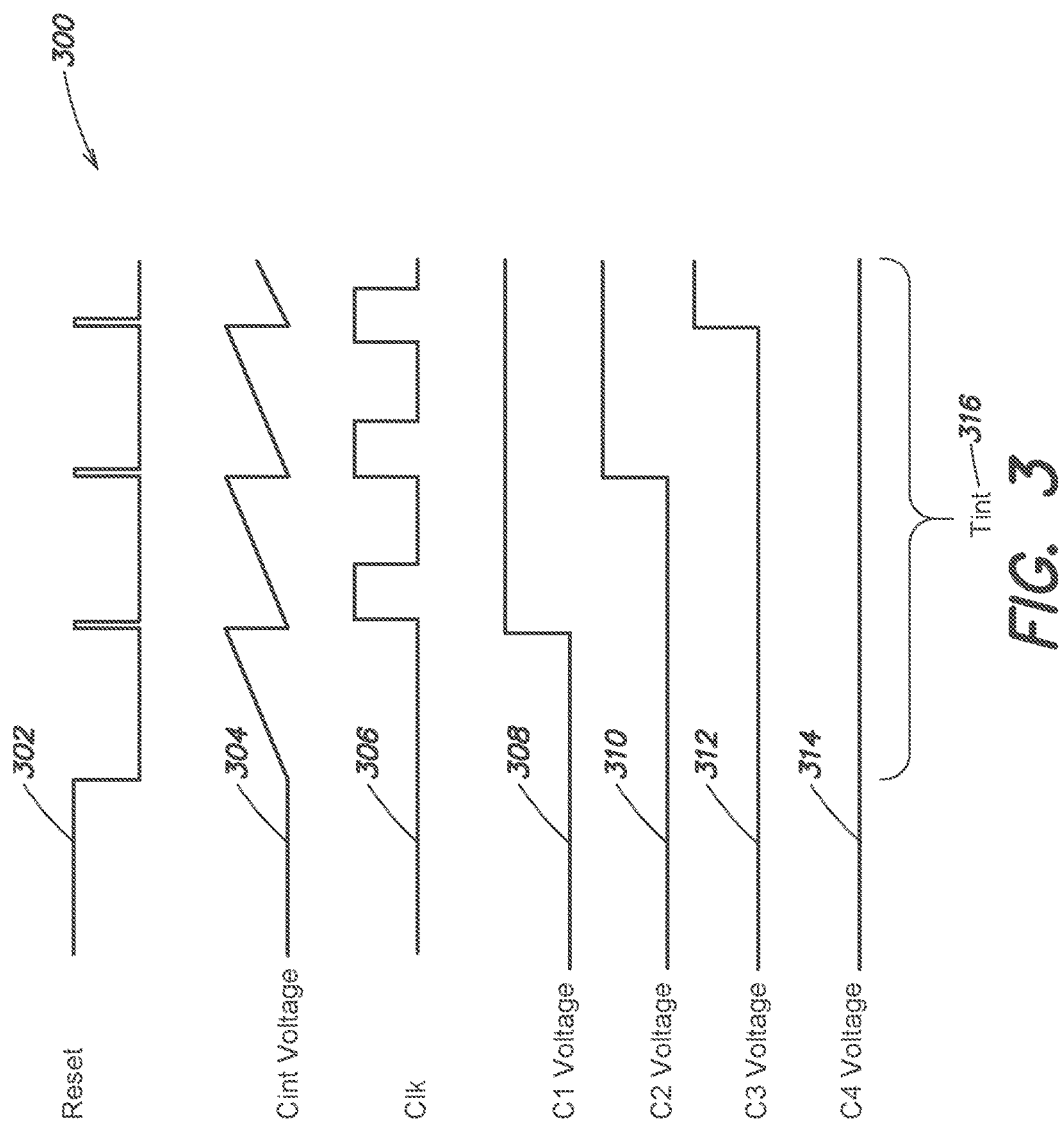

METHOD FOR SHIFT REGISTER DIGITAL IN PIXEL UNIT CELL

BACKGROUND

There are many different types of image capturing devices such as digital cameras, video cameras, or other photographic and/or image capturing equipment. These image capturing devices may use image sensors to capture images from a desired scene. For example, an image sensor may include an array of unit cells (i.e., a focal plane array) that receives light via a lens or other focusing optic. The received light causes each unit cell in the array to accumulate an electric charge proportional to the light intensity at its location.

A focal plane array typically includes a two-dimensional array of unit cells organized by columns and rows. It is common for a circuit or imager within a unit cell to accumulate charge from a photo-diode, the charge corresponding to the flux of light of various wavelengths incident on the photo-diode. Often, the charge is accumulated on a capacitive element which effectively integrates charge, producing a voltage that corresponds to the intensity of the flux over a given time interval called an integration interval or integration period.

Each unit cell in a focal plane array generally corresponds to a picture element, or pixel, in the final image of the desired scene. A pixel is considered the smallest portion of a digital image. A digital image is generally made up of an array of pixels. Circuitry coupled to the image capturing device may perform post light capture processing steps to convert the accumulated charges from each unit cell into pixel information. This information may include the color, saturation, brightness, or other information that a digital image storage format may require. Digital images may be stored in formats such as .JPG, .GIF, .TIFF, or any other suitable format.

In a traditional analog unit cell, a well capacitor is coupled to a detector diode. The well capacitor integrates photo-current from the detector diode over an integration interval (e.g., 10 μs). Once per frame, the voltage on the well capacitor is transferred to a sample-and-hold capacitor and then transferred out, line by line, to an Analog to Digital Converter (ADC) which converts the voltage to a binary value. However, as unit cell sizes have decreased, the ability of the well capacitor to store an effective amount of charge has diminished.

Traditional "digital" unit cells provide for the Analog to Digital Conversion (ADC) of accumulated charge. In-unit cell ADC imaging offers improved photo-charge capacity even as the desired size of unit cells continues to shrink (e.g., below 15 microns). For example, a traditional digital unit cell design includes a quantizing analog front end circuit which accumulates charge over a relatively small capacitor and is reset (i.e., discharged) each time a threshold charge is stored on the capacitor. The pattern of charging and resetting is repeated as more photo-current integrates. Each reset event is "accumulated" (i.e., counted) with a digital counter circuit. Each frame, a global snapshot is taken by copying the digital counter contents to a snapshot register and then reading the snapshot registers out, line by line. The effect is to increase well capacity of the imager while maintaining a relatively small unit cell size.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 3 includes graphs illustrating operation of a digital unit cell circuit according to aspects of the invention.

SUMMARY

Figure 1:
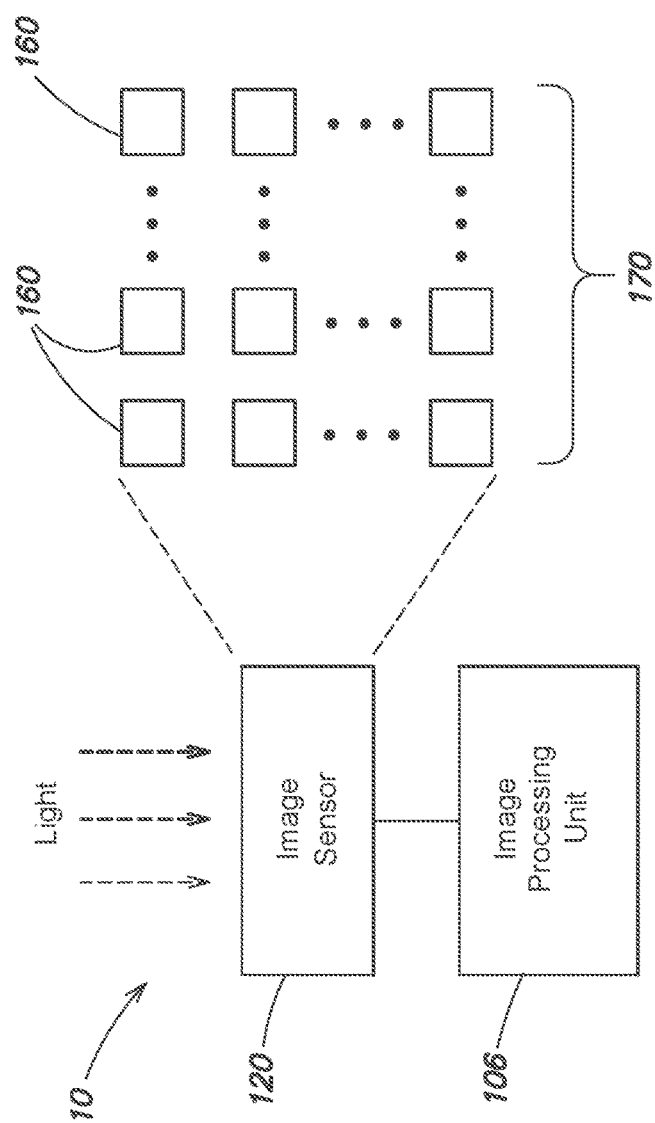
FIG. 1 is a block diagram illustrating an image capture device according to aspects of the invention.

A shift register based digital counter is provided herein that is relatively low cost and does not require calibration. Each time the voltage across an integration capacitor exceeds a voltage reference, the shift register based digital counter shifts charge through the register such that the "bits" read out from the counter are indicative of the number of times that the voltage across the integration capacitor exceeded the voltage reference.

At least one aspect of the invention is directed to a digital unit cell comprising a photodiode, an integration capacitor coupled to the photodiode and configured to accumulate charge generated by the photodiode responsive to an input light signal incident on the photodiode over an integration period, a comparator coupled to the integration capacitor and configured to compare a voltage across the integration capacitor with a voltage reference and to generate a clock signal at a first level each time a determination is made that the voltage across the integration capacitor is greater than the voltage reference, a shift register coupled to the comparator and configured to receive the clock signal from the comparator and increase a count value each time the clock signal at the first level is received from the comparator, and an output coupled to the shift register and configured to provide the count value to an external system.

According to one embodiment, the shift register is a Bucket Brigade Device (BBD). In one embodiment, the shift register comprises a plurality of transistors coupled to the comparator and configured to receive the clock signal. In another embodiment, the shift register further comprises a plurality of capacitors coupled to the plurality of transistors, and in response to receiving the clock signal at the first level from the comparator, the plurality of transistors is configured to operate to propagate charge through the plurality of capacitors. In one embodiment, in response to receiving the clock signal at the first level from the comparator a first time, the plurality of transistors is configured to operate to store charge on a first capacitor of the plurality of capacitors. In another embodiment, the digital unit cell further comprises a reset switch coupled to the shift register and configured to selectively couple the first capacitor to ground.

According to another embodiment, in response to receiving the clock signal at the first level from the comparator a second time, the plurality of transistors is configured to operate to propagate the stored charge from the first capacitor to a second capacitor of the plurality of capacitors. In one embodiment, the count value provided by the output is indicative of a number of capacitors in the plurality of capacitors through which the charge has propagated. In another embodiment, the shift register further comprises a plurality of resistors coupled to the plurality of transistors.

According to one embodiment, the digital unit cell further comprises a residual circuit coupled to the integration capacitor and configured to convert charge stored on the integration capacitor at an end of the integration period into a digital signal.

Another aspect of the invention is directed to a method for operating a digital unit cell comprising a photodiode and an integration capacitor, the method comprising generating charge in response to an input light signal incident on the photodiode over an integration period, accumulating the charge on the integration capacitor, comparing a voltage across the integration capacitor with a reference voltage, increasing a count value of a shift register each time a determination is made that the voltage across the integration capacitor is greater than the voltage reference, and providing the count value to an output of the digital unit cell.

According to one embodiment, increasing the count value of the shift register comprises propagating charge through a plurality of capacitors in the shift register. In one embodiment, providing the count value to the output comprises providing the count value to the output which is indicative of a number of capacitors in the plurality of capacitors through which charge has propagated.

According to another embodiment, propagating charge through the plurality of capacitors in the shift register comprises storing charge on a first capacitor of the plurality of capacitors the first time a determination is made that the voltage across the integration capacitor is greater than the voltage reference. In one embodiment, the method further comprises, prior to the integration period, coupling the first capacitor to ground. In another embodiment, propagating charge through the plurality of capacitors in the shift register comprises in response to determining, a second time, that the voltage across the integration capacitor is greater than the voltage reference, propagating the stored charge from the first capacitor to a second capacitor of the plurality of capacitors.

According to one embodiment, the method further comprises converting, at an end of the integration period, a residual charge on the integration capacitor into a digital signal. In one embodiment, the method further comprises calculating an intensity of the input light signal based on the count value and the digital signal.

At least one aspect of the invention is directed to an image sensor comprising an image processing circuit, and an array of unit cells coupled to the image processing circuit, each unit cell including a photodiode, an integration capacitor coupled to the photodiode and configured to accumulate charge generated by the photodiode responsive to an input light signal incident on the photodiode over an integration period, a comparator coupled to the integration capacitor and configured to compare a voltage across the integration capacitor with a voltage reference and to generate a clock signal at a first level each time a determination is made that the voltage across the integration capacitor is greater than the voltage reference, a shift register coupled to the comparator and configured to receive the clock signal from the comparator and increase a count value each time the clock signal at the first level is received from the comparator, and an output coupled to the shift register and configured to provide the count value to the image processing circuit, wherein the image processing circuit is configured to calculate an intensity of the input light signal incident on each photodiode based at least in part on the count value from each unit cell.

According to one embodiment, each unit cell further comprises a residual circuit coupled to the integration capacitor and configured to convert charge stored on the integration capacitor at an end of the integration period into a digital signal, and the image processing circuit is configured to calculate the intensity of the input light signal incident on each photodiode based on the count value from each unit cell and the digital signal from each residual circuit.

DETAILED DESCRIPTION

As discussed above, an image sensor of an image capture device may include an array of analog or digital unit cells that is configured to receive light from a viewed scene. The received light causes each unit cell in the array to accumulate an electric charge proportional to the light intensity at its location and image processing circuitry coupled to each unit cell converts the accumulated charges into image information corresponding to the viewed scene.

Digital unit cells integrate charge similar to analog unit cells; however, when an integrated charge of a digital unit cell exceeds a maximum level, additional circuitry inside the digital unit cell removes the integrated charge while incrementing a separate counter value. After the integration charge is removed (and the counter incremented), the integration of charge in the digital unit cell begins again. Digital unit cells therefore require a counting element that is configured to be incremented each time the integration node is reset (i.e., each time the charge is removed from the unit cell).

Analog counters typically require digitization (i.e., Analog to Digital converters), calibration, and post Non-Uniformity Correction (NUC) to recover a digital count value. In addition, such analog counters commonly have well size limitations. As such, a digital counter element is commonly utilized within a digital unit cell to count the number of times the charge stored on the unit cell has been reset; however, such digital counters are typically large and complex. For example, traditional digital counter implementations utilize multiple transistors per bit (e.g., about 15) and as such, the number of "counter bits" that can physically fit in a unit cell may be limited. In addition, complex digital Focal Plane Array (FPA) circuitry can result in lower Read-out Integrated Circuit (ROIC) yield.

As an alternative to in-unit cell digital counter elements, peripheral (i.e., outside the pixel array) digital counters can be utilized. However, such peripheral digital counters commonly result in the corresponding FPA being relatively large/expensive and usually require numerous interconnections between the unit cell and the peripheral counter. Further, peripheral digital counters typically exhibit relatively high counting/switching noise and can also be somewhat inaccurate as a result of ignoring residual charge stored in the unit cell at the end of an integration period.

Accordingly, aspects and embodiments described herein are directed to a shift register based digital counter that can be utilized in combination with a digital pixel within a unit cell. According to at least one embodiment, the digital counter described herein is relatively low cost and does not require calibration. In addition, the digital counter can reduce feedthrough requirements when compared to analog FPAs and is relatively high performance for long dwell Long Wavelength Infrared (LWIR) and Medium Wavelength Infrared (MWIR) applications. Further, the digital counter maintains full performance by utilizing an analog residual capacitor read approach.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIG. 1 is a block diagram illustrating an image capture device 10 that may be used to capture images according to aspects described herein. For example device 10 may be a digital camera, video camera, or other photographic and/or image capturing equipment. Image capture device 10 comprises image sensor 120 and image processing unit 106. Image sensor 120 may be an Active Pixel Sensor (APS) or other suitable light sensing device that can capture images. Image processing unit 106 may be a combination of hardware, software, and/or firmware that is operable to receive signal information from image sensor 120 and convert the signal information into a digital image.

Image sensor 120 includes an array 170 of unit cells 160. Each unit cell 160 accumulates charge proportional to the light intensity at that location in the field of view and provides an indication of the intensity of light at that location to the image processing unit 106. Each unit cell 160 may correspond to a pixel in the captured electronic image.

A particular method for image capture using image capture device 10 may be ripple capture. Ripple capture is a method that captures each row of unit cells 160 from image sensor 120 in order. For example, ripple capture may expose the top row of unit cells 160 of image sensor 120 to light, followed by the second row, followed by the third row, and so forth until the last row of unit cells 160 of image sensor 120 is exposed to light. Another particular method for image processing unit 106 to receive pixel information captured by image sensor 120 may be ripple read. Ripple read is a method that processes each row of unit cells 160 from image sensor 120 in order. Similar to ripple capture, ripple read may process the top row of unit cells 160 of image sensor 120, followed by the second row, followed by the third row, and so forth until the last row of unit cells 160 of image sensor 120 is processed. A ripple reset operation to reset the rows of unit cells 160 of image sensor 120 may be performed similarly.

These methods may be performed on consecutive rows. For example, a ripple capture operation may begin with the first row of unit cells 160 of image sensor 120. As the ripple capture operation moves to the second row, a ripple read operation may begin on the first row of image sensor 120. After the ripple capture operation moves to the third row, the ripple read operation may begin on the second row and a ripple reset operation may begin on the first row. This may continue until the last row is processed. Once the last row is processed, the image may be processed, stored, and/or transmitted by the image processing unit 106.

Figure 2:
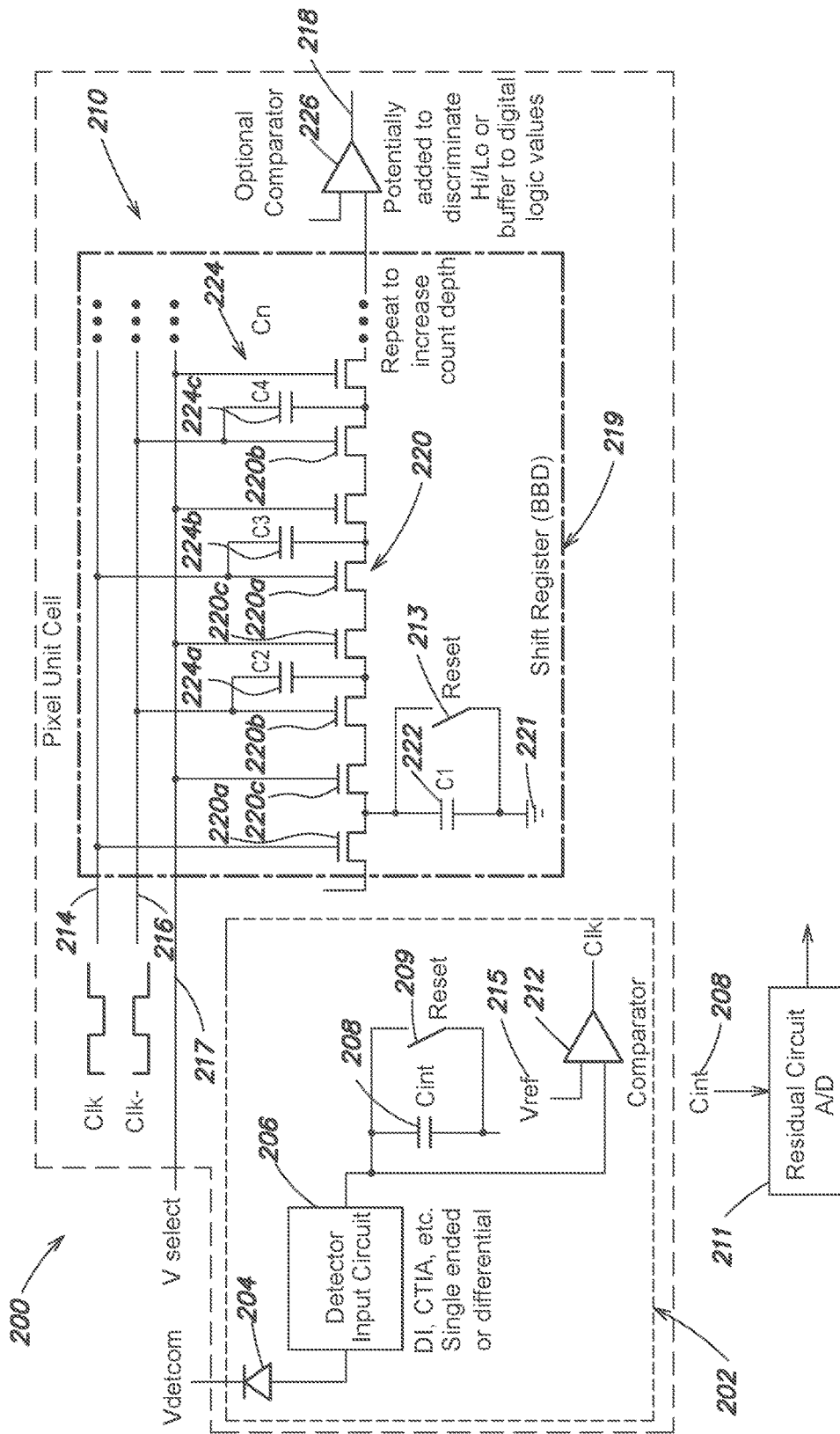
FIG. 2 is a block diagram illustrating a digital unit cell according to aspects of the invention.

FIG. 2 is a block diagram illustrating a digital unit cell 200 according to aspects described herein. The digital unit cell 200 is included in at least one of the unit cells 160 of FIG. 1 and includes an input circuit 202, a counter 210, and a residual circuit 211. The input circuit 202 includes a photodetector 204, a detector input circuit 206, an integration capacitor 208, a first reset switch 209, and a comparator 212. The photodetector 204 is coupled to the detector input circuit 206. The integration capacitor 208 is coupled to the photodetector 204 and ground. The first reset switch 209 is coupled to the detector input circuit 206 and ground, in parallel with the integration capacitor 208. The comparator 212 is coupled to the detector input circuit 206 and a voltage reference 215. According to one embodiment, the detector input circuit 206 is a Direct Injection (DI) circuit; however, in other embodiments, a different type of input circuit (e.g., a Capacitor Trans-Impedance Amplifier (CTIA)) can be utilized. The detector input circuit 206 can be single ended or differential.

The counter 210 includes a shift register 219, a first input for receiving a first clock signal (Clk) 214, a second input for receiving a second clock signal (Clk−) 216, and an output 218. The shift register 219 is coupled to the first clock signal 214, the second clock signal 216, and the output 218. According to one embodiment (e.g., as shown in FIG. 2), the shift register 219 is a Bucket Brigade Device (BBD). The BBD shift register 219 includes a plurality of transistors 220, a first capacitor (C1) 222, a plurality of capacitors 224 (e.g., a second capacitor (C2) 224a, a third capacitor (C3) 224b, a fourth capacitor (C4) 224c . . . an $n^{th}$ capacitor (Cn)), and a second reset switch 213. The gate of a first portion 220a of the plurality of transistors 220 is coupled to the first clock signal (Clk) 214 and a gate of a second portion 220b of the plurality of transistors 220 is coupled to the second clock signal (Clk−) 216.

The first capacitor (C1) 222 is coupled between the plurality of transistors 220 and ground 221. The second reset switch 213 is coupled between the plurality of transistors 220 and ground 221, in parallel with the first capacitor (C1) 222. Each one of the plurality of capacitors 224 (e.g., the second capacitor (C2) 224a, the third capacitor (C3) 224b, the fourth capacitor (C4) 224c . . . the $n^{th}$ capacitor (Cn)) is coupled between the gate and a terminal of one of the plurality of transistors 220. According to one embodiment, the BBD shift register 219 includes a voltage bias line (Vselect) 217 that is coupled to a third portion 220c of the plurality of transistors 220. The output 218 is coupled to the image processing unit 106. The residual circuit 211 is coupled to the integration capacitor 208 and to the image processing unit 106 of FIG. 1. According to one embodiment, the residual circuit 211 includes at least one Analog to Digital converter coupled to the integration capacitor 208 and an output coupled to the image processing unit 106. Operation of the digital unit cell 200 is discussed below with respect to FIG. 3.

FIG. 3 is a graph 300 illustrating one embodiment of operation of the digital unit cell 200 of FIG. 2. The graph 300 includes a first trace 302 representing a Reset signal provided to the reset switches 209, 213 by a controller (e.g., the image processing unit 106), a second trace 304 representing voltage across the integration capacitor 208, a third trace 306 representing the first clock signal (Clk) 214, a fourth trace 308 representing voltage across the first capacitor (C1) 222, a fifth trace 310 representing voltage across the second capacitor (C2) 224a of the plurality of capacitors 224, a sixth trace 312 representing voltage across the third capacitor (C3) 224b of the plurality of capacitors 224, and a seventh trace 314 representing voltage across the fourth capacitor (C4) 224c of the plurality of capacitors 224.

Prior to the start of an integration period (Tint) 316, the reset signal 302 (e.g., from a controller such as the image processing unit 106) operates the first reset switch 209 of the input circuit 202 to couple the integration capacitor 208 to ground, thereby discharging the integration capacitor 208, and the second reset switch 213 of the shift register 219 to couple the first capacitor (C1) 222 to ground 221, thereby discharging the first capacitor (C1) 222.

At the start of the integration period (Tint) 316, the voltage 304 across the integration capacitor 208 is zero and the image processing unit 106 operates the reset switches 209, 213 to open. As optical radiation (e.g., an input light signal) from a scene is incident on the photodiode 204, a resulting photocurrent from the photodiode 204 is provided to the integration capacitor 208, via the detector input circuit 206, and charge corresponding to the flux of the optical radiation incident on the photodiode 204 accumulates on the integration capacitor 208. As charge accumulates on the integration capacitor 208, the voltage 304 across the integration capacitor 208 increases at a rate equal to the level of the photocurrent divided by the capacitance of the integration capacitor 208 (i.e., the slope of the trace 304 depends on the intensity of the flux of the optical radiation incident on the photodiode 204). The voltage 304 across the integration capacitor 208 is monitored by the comparator 212. More specifically, the voltage 304 across the integration capacitor 208 is compared, by the comparator 212, to the voltage reference 215.

In response to a determination that the volt age 304 across the integration capacitor 208 is less than the voltage reference 215, the comparator 212 outputs the first clock signal (Clk) 214 at a low level. The low level first clock signal (Clk) 214 (and the complementary high level inverted second clock signal (Clk−) 216) is provided to the counter 210. In response to receiving the low level first clock signal (Clk) 214, the counter 210 takes no action, and the voltage 308 across the first capacitor (C1) 222 and each of the plurality of capacitors 224 remains at zero.

In response to a determination that the voltage 304 across the integration capacitor 208 is greater than the voltage reference 215, the comparator 212 outputs the first clock signal (Clk) 214 at a high level. The high level first clock signal (Clk) 214 (and the complementary low level inverted second clock signal (Clk−) 216) is provided to the counter 210. In response to receiving the high level first clock signal (Clk) 214 and the corresponding low level inverted second clock signal (Clk−) 216, the counter 210 operates to store charge on the first capacitor (C1) 222 such that the voltage 308 across the first capacitor (C1) 222 increases to a level indicating that the voltage 304 across the integration capacitor 208 has exceeded the voltage reference 215 one time.

After the voltage 308 across the first capacitor (C1) 222 is increased, the reset signal 302 (e.g., from a controller such as the image processing unit 106) operates the first reset switch 209 of the input circuit 202 to couple the integration capacitor 208 to ground, thereby discharging the integration capacitor 208 and causing the voltage 304 across the integration capacitor 208 to go to zero. Once the integration capacitor 208 is discharged, the first reset switch 209 is opened, and continuing optical radiation from the viewed scene (incident on the photodiode 204) again causes photocurrent from the photodiode 204 to be provided to the integration capacitor 208, via the detector input circuit 206. Charge corresponding to the flux of the optical radiation incident on the photodiode 204 again accumulates on the integration capacitor 208.

The comparator 212 continues to monitor the voltage 304 across the integration capacitor by comparing the voltage 304 to the voltage reference 215. In response to a determination that the voltage 304 across the integration capacitor 208 is less than the voltage reference 215, the comparator 212 outputs the first clock signal (Clk) 214 at the low level. The low level first clock signal (Clk) 214 (and the complementary high level inverted second clock signal (Clk−) 216) is provided to the counter 210. In response to receiving the low level first clock signal (Clk) 214, the counter 210 takes no additional action, the voltage 308 across the first capacitor (C1) 222 remains at a high level, and the voltage across each of the plurality of capacitors 224 remains zero.

In response to a determination that the voltage 304 across the integration capacitor 208 is greater than the voltage reference 215, the comparator 212 outputs the first clock signal (Clk) 214 at the high level to the counter 210. In response to receiving the high level first clock signal (Clk) 214 (and the complementary low level inverted second clock signal (Clk−) 216) the counter 210 operates to propagate charge through the shift register 219 such that charge is stored on the second capacitor (C2) 224a of the plurality of capacitors 224, resulting in a voltage 310 across the second capacitor (C2) 224a increasing to a level indicating that the voltage across the integration capacitor 208 has exceeded the voltage reference 215 a second time.

After the voltage 310 across the second capacitor (C2) 224a is increased, the reset signal 302 (e.g., from a controller such as the image processing unit 106) operates the first reset switch 209 of the input circuit 202 to couple the integration capacitor 208 to ground, thereby discharging the integration capacitor 208 and causing the voltage across the integration capacitor 208 to go to zero. Once the integration capacitor 208 is discharged, the first reset switch 209 is opened, and continuing optical radiation from the viewed scene (incident on the photodiode 204) again causes photocurrent from the photodiode 204 to be provided to the integration capacitor 208, via the detector input circuit 206. Charge corresponding to the flux of the optical radiation incident on the photodiode 204 again accumulates on the integration capacitor 208.

The comparator 212 continues to monitor the voltage 304 across the integration capacitor by comparing the voltage 304 to the voltage reference 215. In response to a determination that the voltage 304 across the integration capacitor 208 is less than the voltage reference 215, the comparator 212 outputs the first clock signal (Clk) 214 at the low level. The low level first clock signal (Clk) 214 (and the complementary high level inverted second clock signal (Clk−) 216) is provided to the counter 210. In response to receiving the low level first clock signal (Clk) 214, the counter 210 takes no additional action, the voltage 308 across the first capacitor (C1) 222 remains at a high level, the voltage 310 across the second capacitor (C2) 224a remains at a high level, and the voltage across each other one of the plurality of capacitors 224 remains at zero.

In response to a determination that the voltage 304 across the integration capacitor 208 is greater than the voltage reference 215, the comparator 212 outputs the first clock signal (Clk) 214 at the high level to the counter 210. In response to receiving the high level first clock signal (Clk) 214 (and the complementary low level inverted second clock signal (Clk−) 216) the counter 210 operates to propagate charge through the shift register 219 such that charge is stored on the third capacitor (C3) 224b of the plurality of capacitors 224, resulting in a voltage 312 across the third capacitor (C3) 224b increasing to a level indicating that the voltage across the integration capacitor 208 has exceeded the voltage reference 215 a third time.

After the voltage 312 across the third capacitor (C3) 224b is increased, the reset signal 302 (e.g., from a controller such as the image processing unit 106) operates the first reset switch 209 of the input circuit 202 to couple the integration capacitor 208 to ground, thereby discharging the integration capacitor 208 and causing the voltage across the integration capacitor 208 to go to zero. Once the integration capacitor 208 is discharged, the first reset switch 209 is opened, and continuing optical radiation from the viewed scene (incident on the photodiode 204) again causes photocurrent from the photodiode 204 to be provided to the integration capacitor 208, via the detector input circuit 206. Charge corresponding to the flux of the optical radiation incident on the photodiode 204 again accumulates on the integration capacitor 208.

As shown in FIG. 2, and discussed above, the shift register 219 includes four capacitors; however, in other embodiments, the shift register 219 can include any number of desired capacitors such that the count depth (i.e., count capacity) of the counter can be defined at any desired level. As long as optical radiation from the viewed scene continues to be incident on the unit cell 200, the counter 200 can continue to increase its count value (i.e., propagate charge through the shift register 219) up to its maximum count value.

At the end of the integration period (Tint) 316, the output 218 provides the "bits" or "count value" of the counter 210 (i.e., the voltage level across each capacitor (i.e., the first capacitor (C1) 222 and each of the plurality of capacitors 224) in the shift register 219) to an external system, such as the image processing unit 106, which analyzes the "bits" of the counter 210 to determine the total intensity of optical radiation which was incident on the unit cell 200. In one embodiment, the voltage across each capacitor (i.e., the "bits" of the counter 210) are read out in parallel; however, in other embodiments, the voltage across each capacitor is read out in series. According to one embodiment, the counter 210 further includes a comparator 226 coupled between the plurality of transistors 220 and the output 218. The comparator 226 can be utilized to help discriminate Hi/Lo signals and/or to buffer digital logic values.

The number of "bits" of the counter 210 that are high correlates to the number of times that the voltage across the integration capacitor 208 (due to the optical radiation incident on the unit cell 200) exceeded the voltage reference 215. For example, in response to identifying that three "bits" of the counter 210 are high (i.e., the voltages 308, 310, 312 across the first capacitor (C1) 222, second capacitor (C2) 224a, and third capacitor (C3) 224b are high), the image processing unit 106 determines that the voltage across the integration capacitor 208 (due to the optical radiation incident on the unit cell 200) exceeded the voltage reference 215 three times.

According to one embodiment, the final "bit" of the counter 210 (i.e., the last capacitor (e.g., the fourth capacitor (C4) 224c) in the string of capacitors 224 is utilized as an indicator that the counter 210 has reached its count capacity. For example, if the image processing unit 106 determines that the voltage 314 across the fourth capacitor (C4) 224c (i.e., the final capacitor in the string of capacitors 224 of the counter 210 shown in FIG. 2) is high, the image processing unit 106 can determine that the counter 210 has reached its count capacity.

Also at the end of the integration period (Tint) 316, the residual circuit 211 reads out any residual charge stored on the integration capacitor 208. For example, in at least one embodiment, the A/D converter of the residual circuit 211 generates a digital signal indicative of the level of residual charge stored on the integration capacitor 208 at the end of the integration period (Tin) 316. The digital signal is provided to the image processing unit 106.

Based on the count value from the counter 210 and the digital signal from the residual circuit 211, the image processing unit 106 can calculate the intensity of optical radiation incident on the unit cell 200 during the integration period (Tin) 316. For example, according to at least one embodiment, the image processing unit 106 calculates the intensity of optical radiation incident on the unit cell 200 during the integration period (Tin) 316 (i.e., the "pixel value") by utilizing the following equation:

$$\text{Pixel Value} = (\text{Counter "Bit" Value}) * (\text{Integration Capacitor Capacity}) + \text{Residual (A/D) Value}.$$

As described above, the shift register 219 is a Bucket Brigade Device; however, in other embodiments, a different type of shift register can be utilized. Also as described above, a plurality of capacitors 224 are utilized in the shift register 219; however, in other embodiments, the plurality of capacitors can be replaced by a plurality of resistors. In at least one embodiment, the shift register could be implemented with a cascading transistor latch up and current limiting resistors.

As also described above, the unit cell 200 includes a residual circuit for capturing the residual charge stored on the integration capacitor 208 at the end of the integration; however, in other embodiments, the unit cell 200 may not include the residual circuit.

As described above, a shift register based digital counter is described that can be utilized in combination with a digital pixel within a unit cell. According to at least one embodiment, the digital counter described herein is relatively low cost and does not require calibration. Further, the digital counter can require fewer transistors than traditional digital counters. In addition, the digital counter can reduce feedthrough requirements when compared to analog focal plane arrays and is relatively high performance for long dwell Long Wavelength Infrared (LWIR) and Medium Wavelength Infrared (MWIR) applications. Further, the digital counter maintains full performance by utilizing an analog residual capacitor read approach.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A digital unit cell comprising:
   a photodiode;
   an integration capacitor coupled to the photodiode and configured to accumulate charge generated by the photodiode responsive to an input light signal incident on the photodiode over an integration period;
   a comparator coupled to the integration capacitor and configured to compare a voltage across the integration capacitor with a voltage reference and to generate a clock signal at a first level each time a determination is made that the voltage across the integration capacitor is greater than the voltage reference;

a shift register coupled to the comparator and configured to receive the clock signal from the comparator and increase a count value each time the clock signal at the first level is received from the comparator; and an output coupled to the shift register and configured to provide the count value to an external system.

2. The digital unit cell of claim 1, wherein the shift register is a Bucket Brigade Device (BBD).

3. The digital unit cell of claim 1, wherein the shift register comprises a plurality of transistors coupled to the comparator and configured to receive the clock signal.

4. The digital unit cell of claim 3, wherein the shift register further comprises a plurality of capacitors coupled to the plurality of transistors, and wherein in response to receiving the clock signal at the first level from the comparator, the plurality of transistors is configured to operate to propagate charge through the plurality of capacitors.

5. The digital unit cell of claim 4, wherein in response to receiving the clock signal at the first level from the comparator a first time, the plurality of transistors is configured to operate to store charge on a first capacitor of the plurality of capacitors.

6. The digital unit cell of claim 5, further comprising a reset switch coupled to the shift register and configured to selectively couple the first capacitor to ground.

7. The digital unit cell of claim 5, wherein in response to receiving the clock signal at the first level from the comparator a second time, the plurality of transistors is configured to operate to propagate the stored charge from the first capacitor to a second capacitor of the plurality of capacitors.

8. The digital unit cell of claim 4, wherein the count value provided by the output is indicative of a number of capacitors in the plurality of capacitors through which the charge has propagated.

9. The digital unit cell of claim 3, wherein the shift register further comprises a plurality of resistors coupled to the plurality of transistors.

10. The digital unit cell of claim 1, further comprising a residual circuit coupled to the integration capacitor and configured to convert charge stored on the integration capacitor at an end of the integration period into a digital signal.

11. A method for operating a digital unit cell comprising a photodiode and an integration capacitor, the method comprising:

generating charge in response to an input light signal incident on the photodiode over an integration period;

accumulating the charge on the integration capacitor;

comparing a voltage across the integration capacitor with a reference voltage;

increasing a count value of a shift register each time a determination is made that the voltage across the integration capacitor is greater than the voltage reference; and providing the count value to an output of the digital unit cell.

12. The method of claim 11, wherein increasing the count value of the shift register comprises propagating charge through a plurality of capacitors in the shift register.

13. The method of claim 12, wherein providing the count value to the output comprises providing the count value to the output which is indicative of a number of capacitors in the plurality of capacitors through which charge has propagated.

14. The method of claim 12, wherein propagating charge through the plurality of capacitors in the shift register comprises:

storing charge on a first capacitor of the plurality of capacitors the first time a determination is made that the voltage across the integration capacitor is greater than the voltage reference.

15. The method of claim 14, further comprising, prior to the integration period, coupling the first capacitor to ground.

16. The method of claim 14, wherein propagating charge through the plurality of capacitors in the shift register comprises:

in response to determining, a second time, that the voltage across the integration capacitor is greater than the voltage reference, propagating the stored charge from the first capacitor to a second capacitor of the plurality of capacitors.

17. The method of claim 11, further comprising converting, at an end of the integration period, a residual charge on the integration capacitor into a digital signal.

18. The method of claim 17, further comprising calculating an intensity of the input light signal based on the count value and the digital signal.

19. An image sensor comprising:

an image processing circuit; and an array of unit cells coupled to the image processing circuit, each unit cell including:

a photodiode;

an integration capacitor coupled to the photodiode and configured to accumulate charge generated by the photodiode responsive to an input light signal incident on the photodiode over an integration period;

a comparator coupled to the integration capacitor and configured to compare a voltage across the integration capacitor with a voltage reference and to generate a clock signal at a first level each time a determination is made that the voltage across the integration capacitor is greater than the voltage reference;

a shift register coupled to the comparator and configured to receive the clock signal from the comparator and increase a count value each time the clock signal at the first level is received from the comparator; and an output coupled to the shift register and configured to provide the count value to the image processing circuit, wherein the image processing circuit is configured to calculate an intensity of the input light signal incident on each photodiode based at least in part on the count value from each unit cell.

20. The image sensor of claim 19, wherein each unit cell further comprises a residual circuit coupled to the integration capacitor and configured to convert charge stored on the integration capacitor at an end of the integration period into a digital signal, and wherein the image processing circuit is configured to calculate the intensity of the input light signal incident on each photodiode based on the count value from each unit cell and the digital signal from each residual circuit.

* * * * *